(12) United States Patent
Meyer et al.

(10) Patent No.: US 7,642,777 B1
(45) Date of Patent: Jan. 5, 2010

(54) FAST AUTOMATIC LINEAR OFF-RESONANCE CORRECTION METHOD FOR SPIRAL IMAGING

(75) Inventors: Craig H. Meyer, Charlottesville, VA (US); Weitian Chen, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 311 days.

(21) Appl. No.: 11/892,261

(22) Filed: Aug. 21, 2007

Related U.S. Application Data

(60) Provisional application No. 60/839,037, filed on Aug. 21, 2006.

(51) Int. Cl.
*G01V 3/00* (2006.01)
(52) U.S. Cl. .................................. 324/309; 324/310
(58) Field of Classification Search ................ 324/309, 324/310, 312
See application file for complete search history.

(56) References Cited

U.S. PATENT DOCUMENTS

| | | | |
|---|---|---|---|
| 5,311,132 A | | 5/1994 | Noll et al. |
| 5,617,028 A | * | 4/1997 | Meyer et al. ............... 324/320 |
| 5,905,337 A | | 5/1999 | Dreano et al. |
| 6,292,684 B1 | | 9/2001 | Du et al. |
| 6,341,179 B1 | | 1/2002 | Stoyle et al. |
| 6,763,148 B1 | | 7/2004 | Sternberg et al. |
| 6,995,560 B2 | | 2/2006 | Duerk et al. |
| 7,042,215 B2 | | 5/2006 | Moriguchi et al. |
| 7,545,966 B2 | * | 6/2009 | Lewin et al. ................. 382/128 |
| 2005/0033153 A1 | | 2/2005 | Moriguchi et al. |

OTHER PUBLICATIONS

Nayak, Krishna S. et al., Efficient Off-Resonance Correction for Spiral Imaging, Magnetic Resonance in Medicine 45:521-524 (2001).
Ahunbay, Ergun et al., Rapid Method for Deblurring Spiral MR Images, Magnetic Resonance in Medicine 44:491-494 (2000).
Sutton, Bradley P. et al., Fast, Interactive Image Reconstruction for MRI in the Presence of Field Inhomogeneities, IEEE Transactions on Medical Imaging, vol. 22, No. 2, Feb. 2003, pp. 178-188.
Irarrazabal, Pablo et al., Inhomogeneity Correction Using an Estimated Linear Field Map, Magnetic Resonance in Medicine, 35:278-282 (1996).
Noll, Douglas C. et al., A Homogeneity Correction Method for Magnetic resonance Imaging with Time-Varying Gradients, IEEE Transactions on Medical Imaging, vol. 10, No. 4, Dec. 1991.
Schomberg, Hermann, Off-Resonance Correction of MR Images, IEEE Transactions on Medical Imaging, vol. 18, No. 6, Jun. 1999.

(Continued)

*Primary Examiner*—Louis M Arana
(74) *Attorney, Agent, or Firm*—Blank Rome LLP

(57) ABSTRACT

A fast automatic linear off-resonance correction method for MRI data uses a set of widely spaced demodulation frequencies to estimate a low-resolution field map from the image itself. A linear map is determined by fitting to this low-resolution map using a maximum-likelihood estimator with weights proportional to the pixel intensity.

16 Claims, 5 Drawing Sheets

OTHER PUBLICATIONS

Man, Lai-Chee et al., Multifrequency Interpolation for Fast Off-resonance Correction, Magnetic Resonance in Medicine 37:785-792 (1997).

Noll, Douglas C. et al., Homodyne Detection in Magnetic Resonance Imaging, IEEE Transactions on medical Imaging, vol. 10, No. 2, Jun. 1991.

Lee, D. et al, Reducing Spurious Minima in Automatic Off-Resonance Correction For Spiral Imaging, Proc. Intl. Soc. Mag. Reson. Med. 11 (2004), p. 2678.

Noll, Douglas C. et al., Conjugate Phase MRI Reconstruction With Spatially Variant Sample Density Correction, IEEE Transactions on Medical Imaging, vol. 24, No. 3, Mar. 2005, pp. 325-336.

Rasche, V. et al., Resampling of Data Between Arbitrary Grids Using Convolution Interpolation, IEEE Transactions on Medical Imaging, vol. 18, No. 5, May 1999, pp. 385-392.

Rasche, V. et al., Resampling of Data Between Arbitrary Grids Using Convolution Interpolation, IEEE Transactions on Medical Imaging, vol. 18, No. 5, May 1999, pp. 385-392.

Hoge, Richard D. et al, Density Compensation Functions for Spiral MRI, Magnetic Resonance in Medicine 38:117-128 (1997).

Jackson John I. et al., Selection of a Convolution Function for Fourier Inversion Using Gridding, IEEE Transactions on Medical Imaging, vol. 10, No. 3, Sep. 1991, pp. 473-478.

Meyer, Craig H., Fast-Scan Imaging, IEEE International Symposium 2004, 2:1196-1199.

Man, Lai-Chee et al., Improved Automatic Off-Resonance Correction Without a Field Map in Spiral Imaging, Magnetic Resonance in Medicine 37:906-913 (1997).

Noll, Douglas C. et al., Deblurring for Non-2D Fourier Transform magnetic Resonance Imaging, Magnetic Resonance in Medicine 25:319-333 (1992).

Sutton, Bradley P. et al., Dynamic Field Map Estimation Using a Spiral-In/Spiral-Out Acquisition, Magnetic Resonance in Medicine 51:1194-1204 (2004).

Meyer, Craig H. et al., Simultaneous Spatial and Spectral Selective Excitation, Magnetic Resonance in Medicine 15:287-304 (1990).

* cited by examiner

FIG. 2A
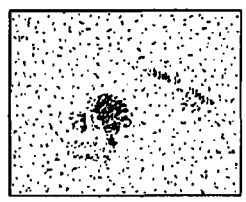
FIG. 2B
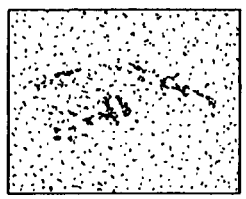
FIG. 2C
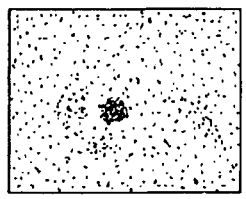
FIG. 2D
FIG. 3A       FIG. 3B
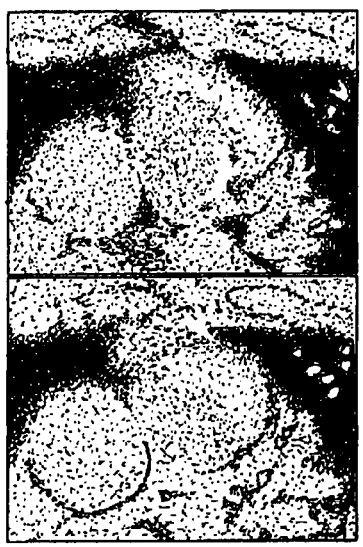
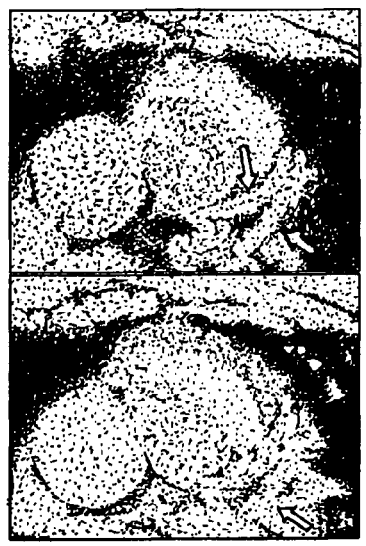
FIG. 3C       FIG. 3D
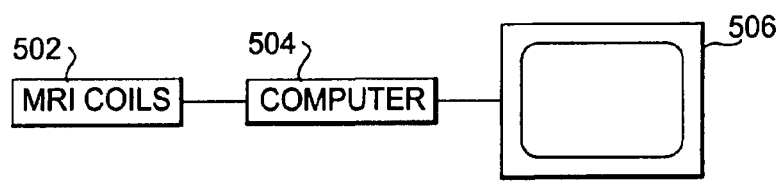
FIG. 5

FAST AUTOMATIC LINEAR OFF-RESONANCE CORRECTION METHOD FOR SPIRAL IMAGING

REFERENCE TO RELATED APPLICATION

The present application claims the benefit of U.S. Provisional Patent Application No. 60/839,037, filed Aug. 21, 2006, whose disclosure is hereby incorporated by reference in its entirety into the present disclosure.

FIELD OF THE INVENTION

The present invention is directed to the correction of off-resonance in magnetic resonance imaging and more particularly to such correction with improved speed.

DESCRIPTION OF RELATED ART

Off-resonance commonly exists in MRI. The chemical shift between fat and water is one main source of off-resonance, which can be suppressed by a spectral-spatial pulse (I) or fat presaturation technique. Other sources of off-resonance are the main field inhomogeneity and tissue-induced susceptibility changes. Off-resonance causes only image misregistration of pixels for 2DFT data acquisition, which is usually not a serious problem. However, for non-2DFT data acquisitions, such as projection reconstruction and spiral imaging, off-resonance can cause image blurring (2,3), which may impair the diagnostic value of the resulting images. Many postprocessing off-resonance correction methods have been proposed to correct this blurring (4-12). Most of these methods are based on an acquired field map (4-9). Among them, linear off-resonance correction (6) is one of the most widely used because it requires little additional computation and is more robust in regions with low signal-to-noise ratio (SNR) than full field map correction methods. However, the field map-based off-resonance corrections prolong the scan time. This makes them undesirable for real-time imaging and dynamic imaging, where the inhomogeneity can vary during the time course due to cardiac and respiratory effects. Extra field map acquisitions are also undesirable in hyperpolarized gas imaging (13) because the longitudinal magnetization of hyperpolarized gas cannot be recovered after excitation. Since the field map itself can be blurred and distorted by the offresonance, field map-based methods can be unreliable in the presence of strong inhomogeneity.

A group of automatic off-resonance correction methods (11,12) can partly solve the difficulties of the map-based off-resonance correction methods in the above conditions. Without collecting any extra map images, automatic methods estimate a field map directly from the image itself. To implement the automatic off-resonance correction methods, one can demodulate the signal by a series of constant demodulation frequencies and reconstruct images for each set of demodulated signals. The local off-resonance frequency is then chosen as the value of the demodulation frequency that minimizes a predefined objective function. Such an objective function usually reflects the degree of the blurring of the image over a local region. The automatic methods, however, suffer from a relatively high computational cost and probability of estimation error.

Throughout the specification, the following references will be referred to by the numbers indicated. Their disclosures are hereby incorporated by reference in their entireties into the present disclosure.

1. Meyer C H, Pauly J M, Macovski A, Nishimura DG. Simultaneous spatial and spectral selective excitation. Magn Reson Med 1998; 15:287-304.
2. Yudilevich E, Stark H. Spiral sampling in magnetic resonance imaging—the effect of inhomogeneities. IEEE Trans Med Imaging 1987; 6:337-345.
3. Schomberg H. Off-resonance correction of MR images. IEEE Trans Med Imaging 1999; 18:481-495.
4. Shenberg I, Macovski A. Inhomogeneity and multiple dimension considerations in magnetic resonance imaging with time-varying gradients. IEEE Trans Med Imaging 1985; MI-4:165-174.
5. Noll D C, Meyer C H, Pauly J M, Nishimura DG. A homogeneity correction method for magnetic resonance imaging with time-varying gradients. IEEE Trans Med Imaging 1991; 10:629-637.
6. Irarrazabal P, Meyer C H, Nishimura D G, Macovski A. Inhomogeneity correction using an estimated linear field map. Magn Reson Med 1996; 35:278-282.
7. Ahunbay E, Pipe J G. Rapid method for deblurring spiral MR images. Magn Reson Med 2000; 44:491-494.
8. Sutton B P, Noll D C, Fessler J A. Fast, iterative image reconstruction for MRI in the presence of field inhomogeneities. IEEE Trans Med Imaging 2003; 22:178-188.
9. Nayak K S, Tsai C M, Meyer C H, Nishimura D G. Efficient off-resonance correction for spiral imaging. Magn Reson Med 2001; 45:521-524.
10. Sutton B P, Noll D C, Fessler J A. Dynamic field map estimation using a spiral-in/spiral-out acquisition Magn Reson Med 2004; 51:1194-1204.
11. Noll D C, Pauly J M, Meyer C H, Nishimura D G, Macovski A. Deblurring for non-2DFT MRI. Magn Reson Med 1992; 25:319-333.
12. Man L C, Pauly J M, Macovski A. Improved automatic off-resonance correction without a field map in spiral imaging. Magn Reson Med 1997; 37:906-913.
13. Salerno M, Altes T A, Brookeman J R, de Lange E E, Mugler J P. Dynamic spiral MRI of pulmonary gas flow using hyperpolarized (3)He: preliminary studies in healthy and diseased lungs, Magn Reson Med 2001; 46:667-677.
14. Jackson J I, Meyer C H, Nishimura D G, Macovski A. Selection of a convolution function for Fourier inversion using gridding. IEEE Trans Med Imaging 1991; 10:473-478.
15. Meyer C H. Fast scan imaging. In: Biomedical imaging: macro to nano. IEEE Int Symp 2004; 2:1196-1199.
16. Hoge R D, Kwan R K, Pike G B. Density compensation functions for spiral MRI. Magn Reson Med 1997; 38:117-128.
17. Noll D C, Fessler J A, Sutton B P. Conjugate phase MRI reconstruction with spatially variant sample density correction IEEE Trans Med Imaging 2005; 24:325-336.
18. Rasche V, Proksa R, Sinkus R, Bornert P, Eggers H. Resampling of data between arbitrary grids using convolution interpolation. IEEE Trans Med Imaging 1999; 18:385-392.
19. Lee D, Nayak K S, Pauly J M. Reducing spurious minima in automatic off-resonance correction for spiral imaging. In: Proceedings of the $12^{th}$ Annual Meeting of ISMRM, Kyoto, Japan, 2004. p 2678.
20. Noll D C, Nishimura D G, Macovski A. Homodyne detection in magnetic resonance imaging. IEEE Trans Med Imaging 1991; 10:154-163.
21. Man L C, Pauly J M, Macovski A. Multifrequency interpolation for fast off-resonance correction. Magn Reson Med 1997; 37:785-792.

Also of interest are U.S. Pat. Nos. 7,042,215, 6,995,560, 6,763,148, 6,341,179, 6,292,684, 5,905,337 and 5,311,132 and U.S. Patent Application Publication No. 2005/0033153 A1, all of which are hereby incorporated by reference.

SUMMARY OF THE INVENTION

Our method is more robust than the pixel-by-pixel based automatic off-resonance correction methods in regions with low SNR. It can also be combined with Noll et al.'s (11) automatic method to increase the extent of correction without increasing estimation error.

Field inhomogeneity and susceptibility variations, coupled with a long readout, can result in image blurring in spiral imaging. Many correction methods based on a priori off-resonance information, such as an acquired field map, have been proposed in the literature. Automatic off-resonance correction methods are alternative approaches that estimate a field map from the image data themselves. The present invention provides a fast automatic off-resonance correction method that performs linear correction without acquiring a field map. The method requires only about two times the total computation time compared to image reconstruction by gridding. It can also be used in combination with a full field map automatic off-resonance correction method to increase the extent of correction. The method is demonstrated by in vivo coronary artery imaging.

The present invention provides a fast automatic linear off-resonance correction method that is similar to the field map-based linear off-resonance correction method developed by Irarrazabal et al. (6), but does not require the extra map data acquisition. We use a set of widely spaced demodulation frequencies to estimate a low-resolution field map from the image itself. We then determine a linear map by fitting to this low-resolution map using a maximum-likelihood estimator with weights proportional to the pixel intensity (6). The total computation time of our algorithm is about two times that of image reconstruction by gridding (14).

BRIEF DESCRIPTION OF THE DRAWINGS

A preferred embodiment of the present invention will be set forth in detail with reference to the drawings, in which:

FIGS. 2A-2D show the low-resolution weighting magnitude image used for linear map estimation and the estimated low-resolution field maps;

FIGS. 3A-3D show coronary images of a normal volunteer scanned with a spiral sequence;

FIG. 5 is a block diagram showing a system on which the present invention can be implemented.

DETAILED DESCRIPTION OF THE PREFERRED EMBODIMENT

Figure 1A:
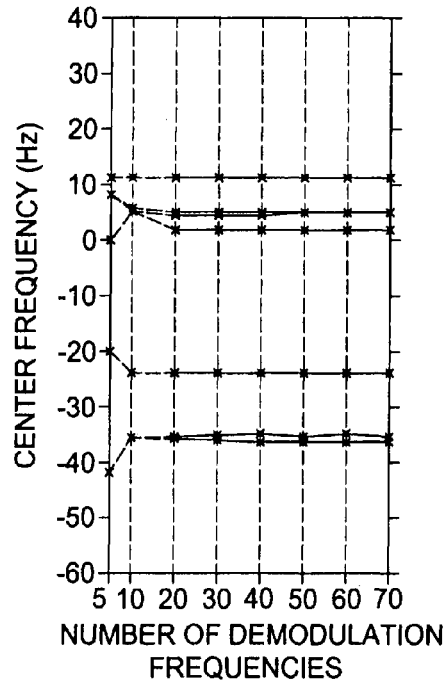
FIGS. 1A-1C show figure shows the estimated linear maps as a function of the number of demodulation frequencies used for the low-resolution field map estimation on seven experimental data sets.

A preferred embodiment of the present invention will be set forth in detail with reference to the drawings, in which like reference numerals refer to like elements or steps throughout.

Linear off-resonance correction is accomplished in the following manner. The MR signal, ignoring relaxation, from an object with spin density m(x,y) is given by $$s(t) = \int \int m(x,y) \exp(-i2\pi(k_x(t)x + k_y(t)y + f(x,y)t)) dx dy \quad (1)$$

where $k_x(t)$ and $k_y(t)$ are the x and y components of the k-space trajectory, respectively, and f(x,y) is the spatial distribution of the resonant frequency.

Assume there is only one linear field variation, namely, $$f(x,y) = f_0 + \alpha x + \beta y \quad (2)$$

where $f_0$ is the center frequency and $\alpha$ and $\beta$ are the x and y gradients of the linear map, respectively. The signal equation can be rewritten as $$s'(t) = \int \int m(x,y) \exp(-i2\pi(k_x'(t)x + k_y'(t)y)) dx dy \quad (3)$$

with
$s'(t) \equiv s(t) \cdot \exp(i2\pi f_0 t)$
$k_x'(t) \equiv k_x(t) + \alpha t$
$k_y'(t) \equiv k_y(t) + \beta t$ The image can be reconstructed from the signal by gridding (14). For a gridding reconstruction, the varying density in k-space must be compensated for. Note that the k-space trajectories are different in Eqs. [1] and [3]. Irarrazabal et al. (6) used a postgridding compensation to account for the possible density change before and after trajectory warping. However, the postcompensation will not work well when the density of the trajectory changes significantly over a region of k-space the size of the convolution kernel, and it also causes the deapodization to fail because the density compensation and convolution do not commute (15). In our experiments we used a pregridding density compensation. Since the change in k-space density was small in our experiments, we did not correct the density compensation for the k-space trajectory warping. When the k-space density changes significantly after trajectory warping, one can calculate the density compensation of the warped trajectory as the Jacobian of the transformation from the (t, ϕ) domain to the ($k_x$, $k_y$) domain (16,17) or use numerical methods (18).

The objective function for automatic off-resonance correction will now be described. Field maps can be estimated by automatic methods with no extra data acquisition. The rationale behind such methods is to reconstruct images at various off-resonance frequencies and choose the one that can minimize the blur. To characterize the degree of blur at an arbitrary pixel, Noll et al. (11) proposed the summation of the imaginary component of the image with power $\alpha$ as an objective measure:

$$\varepsilon(x, y; \Delta\omega_i) = \int \int_{W(x,y)} \psi(x, y; \Delta\omega_i) dx dy \quad (4)$$

with kernel function $$\psi(x,y;\Delta\omega_i) = |Im\{I(x,y;\Delta\omega_i)\}|^\alpha \quad (5)$$

where $I(x,y;\Delta\omega_i)$ is the image reconstructed at off-resonance frequency $\Delta\omega_i$ and W(x,y) is a local summation window around the pixel (x,y). The off-resonance frequency at pixel (x,y) denoted as $\Delta\omega_{L(x,y)}(x,y)$, is chosen such that $L(x,y) = \arg_i \min \varepsilon(x,y;\Delta\omega_i)$.

When the objective function (Eq. [4]) is used to search for the off-resonance frequency within a relatively large frequency range, spurious minima can occur at frequencies away from the correct off-resonance frequency. A relatively large summation window should be used to suppress the spurious minima (12). Theoretically, when the maximum offresonance phase accrual is within ±1 cycle, there will be little chance for this objective function to have spurious minima (19). For a long spiral readout, however, sometimes few data are within this range. Lee et al. (19) proposed the product of image magnitude and image phase as an objective function to decrease the possibility of spurious minima when the signal has large off-resonance phase accrual.

Both Noll et al.'s (11) objective function and Lee et al.'s (19) objective function are based on the fact that the imaginary image is minimized after the phase accrual due to off-resonance during readout is correctly removed. However, in MR images there are always incidental phase variations from various sources, such as imperfect excitation, RF coil response functions, hardware timing issues, flow effects, or phase accrual from inhomogeneity before the first sample. Such incidental phases can induce spurious minima in the objective functions and therefore must be corrected in the objective function. Noll et al. (20) showed theoretically that if the incidental phase is slowly varying, which is usually true in MR images, then a low-pass filtered MR image will have approximately the same incidental phase variation as the image itself. Therefore, we can use low frequency k-space data to reconstruct a low-pass filtered image and use its phase as an approximation to the incidental phase. Another approach is, when reconstructing an image at a constant frequency offset, to use low frequency k-space data to reconstruct a low resolution image at the same constant frequency offset and to remove its phase from the corresponding high resolution image. The rationale behind the second approach is discussed by Noll et al (11). Generally, the second approach is more effective than the first approach but with slightly increased computational cost. A practical note is that, we apply a Hanning window instead of rectangular window when truncating k-space data to reconstruct low resolution images in order to avoid ringing artifacts.

In our experiments we reconstruct the low-pass filtered image by gridding a small portion of signal samples at the beginning of the spiral interleaves. We determine the length of this starting portion of the spiral interleaves experimentally. The value of this parameter is chosen to yield the best deblurring on a representative data set. The same value of this parameter is then used for all the data sets acquired by same sequence in the same scanner. For different sequences, such as a gradient-echo sequence vs. a spin-echo sequence, the parameter is determined separately.

The computation speed is relatively slow if we calculate the objective function (Eq. [4]) at each pixel individually. A much faster way is to calculate it recursively. The objective function (Eq. [4]) is the summation of the objective kernel function (Eq. [5]) within a local window. For two neighboring pixels, (m,n+1) and (m,n), most of their summation windows are overlapping. Therefore, after the objective function $\epsilon(m,n; \Delta\omega_j)$ is calculated, to calculate the objective function $\epsilon(m,n+1; \Delta\omega_i)$ we only need to consider the change caused by the newly added data and the obsolete data. Using a simple mathematical derivation, we have $$\epsilon(m,n+1;\Delta\omega_i) = \epsilon(m,n;\Delta\omega_i) + S_{new} - S_{obsolete} \quad (6)$$

for the objective function (Eq. [4]), wherein $S_{new}$ and $S_{obsolete}$ are the sums of the objective kernel function (Eq. [5]) of the newly added data and the obsolete data, respectively.

When the summation window exceeds the boundaries, we can either pad the image with the zeros at the boundaries or adaptively change the size of the summation window so that it will not exceed the boundary.

The speed improvement for linear automatic off-resonance correction will now be disclosed. A linear automatic off-resonance correction does not require as much computation time as full map automatic off-resonance correction methods because only a linear map is needed. We implemented two strategies to reduce the computation cost for the automatic linear off-resonance correction: 1) using a small image matrix to obtain a low-resolution field map, and 2) using fewer demodulation frequencies. Both of these strategies can greatly reduce the computation time without compromising the accuracy of the linear map estimation.

A low-resolution field map is sufficient to estimate the linear map. Consequently, we can use a much smaller matrix to reconstruct multiple images to estimate a field map, which dramatically reduces the computation time compared to the full field map automatic off-resonance correction. A low-resolution image can be estimated from the low-frequency k-space data. Using low-frequency k-space data in a spiral trajectory not only saves time in gridding, it also reduces the possibility of spurious minima because the signal being used has less off-resonance phase accrual. A Hanning window can be used when truncating k-space data to reconstruct low-resolution images in order to avoid ringing artifacts.

After we obtain the low-spatial-resolution field map, a linear map can be fitted to it by means of a maximum-likelihood estimator, a $\chi^2$ fit, with weights proportional to the image intensity. This fitting scheme is the same as that used by Irarrazabal et al. (6) in their map-based linear correction method. In the automatic linear correction method, our experiments show that given an off-resonance range, the linear map estimated is insensitive to the frequency resolution of the full field map from which the linear map is estimated. Based on this, we can estimate a linear map effectively using a small number of demodulation frequencies to reduce the computational cost.

Figure 1B:
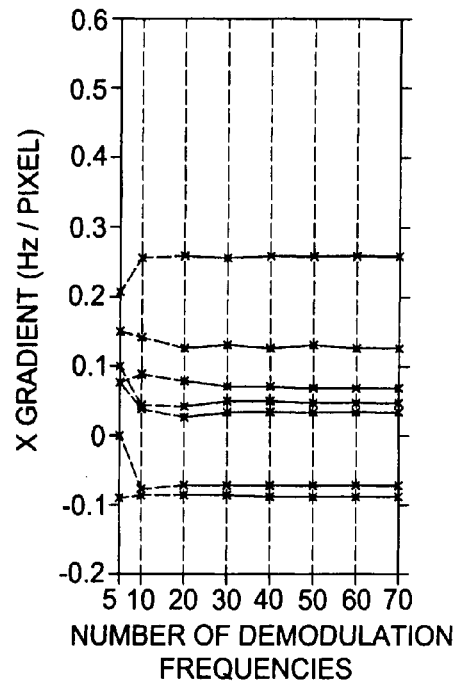
Figure 1C:
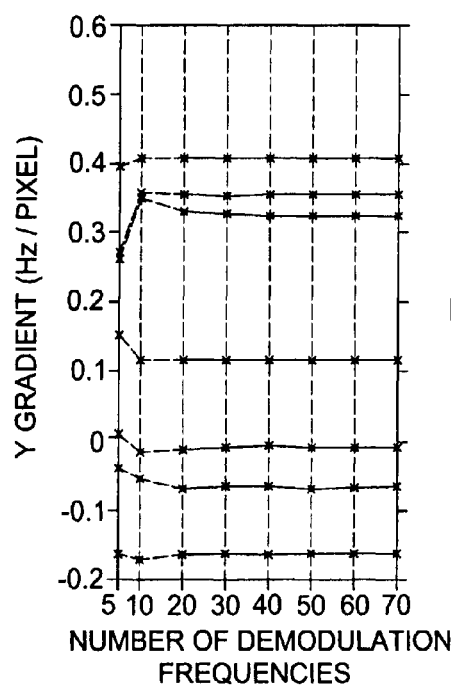

FIGS. 1A-1C show the estimated linear maps as a function of the number of demodulation frequencies on seven different real data sets. The experimental details used for acquiring these data sets and the parameters used for linear automatic deblurring are the same as those used for the example shown in the Results discussion. The range of off-resonance is from −150 Hz to 150 Hz. The solid line in FIGS. 1A-1C shows the variation of estimated linear maps when the number of demodulation frequencies is decreased from 70 to 20. Note that the estimated linear maps show very little variation in this range. The average standard deviation (SD) for the center frequency, X gradient, and Y gradient are only 0.1 Hz, 0.001 Hz/Pixel, and 0.001 Hz/Pixel, respectively. The dashed line in FIGS. 1A-1C shows the estimated linear maps when even fewer demodulation frequencies are used. Note that the estimated linear maps are still approximately correct when only 10 demodulation frequencies (corresponding to a frequency resolution of 33.3 Hz) are used for these data sets. At five demodulation frequencies (corresponding to a frequency resolution of 75 Hz), the estimated linear map becomes erroneous due to the extremely low frequency resolution of the field map. FIG. 1A shows the estimated center frequency (Hz). FIGS. 1B and 1C show the x and y gradients (Hz/pixel) of the linear map, respectively. Note that the linear maps show little variation when the number of demodulation frequencies decreases from 70 to 20. The average SD for the center frequency and the x and y gradients are only 0.1 Hz, 0.001 Hz/pixel, and 0.001 Hz/pixel, respectively. The estimated linear maps were still approximately correct when 10 demodulation frequencies were used, but became erroneous when only five demodulation frequencies were used. The units for the x and y gradients are for a 512×512 image matrix. The horizontal axis is the number of demodulation frequencies.

After all of these strategies are implemented, the total computation time of our method is only about two times that of gridding, which is substantially decreased compared to the computation time of full map automatic off-resonance correction methods (11, 12). More discussion about the computation loads of our method is presented below.

The combination of the automatic linear correction with the full field map-based correction will now be disclosed. In Noll et al.'s (11) original method, searching through a large frequency range can result in spurious minima of the objective function. To avoid this problem, a relatively large summation widow is usually used, but this can result in an over-smoothed field map. Man et al. (12) proposed a two-stage automatic method to solve this problem: in the first stage a field map with low frequency resolution is estimated, and in the second stage a field map with high frequency resolution is determined by searching within a narrower spatially-varying frequency range around the field map estimated in the first stage. Searching within a narrow frequency range allows a small summation window to be used, and thus avoids over-smoothing the field map. Similarly to Man et al.'s (12) method, we can use an estimated linear map as a frequency constraint for the pixel-by-pixel field map estimation. Compared to their method, ours may be less likely to encounter spurious minima in the first-stage field map estimation.

We applied our automatic linear off-resonance correction algorithm to 12 spiral data sets. All of the data sets were acquired on a Siemens Sonata 1.5T scanner (Siemens Medical Solutions). The tests included phantom and in vivo experiments. We acquired both gradient-echo and spin-echo spiral sequences data sets to test our algorithm. The 90° excitation used during data acquisition was a spectral-spatial pulse, so fat was not excited. The readout for each slice was done with 14 interleaved spirals, each of 16.38 ms duration. To compare the deblurring of our method with that of the conventional map-based linear correction method, two additional single-shot spirals (each 16.38 ms in duration) were acquired to estimate a low-resolution field map.

Both Noll et al.'s (11) objective function and Lee et al.'s (19) objective function were tested for linear map estimation. The demodulation frequency range was −150 Hz to 150 Hz. Twenty demodulation frequencies were employed. The final reconstructed image matrix was 512×512. The map image matrix was 64×64. The power a of the objective function used was one. The first 3.3 ms of the readout were used to estimate the low-resolution field map, and the first 0.6 ms of the readout was used to estimate the incidental phase.

Eleven of the tested data sets showed satisfactory deblurring. Both full field map automatic methods and our linear method failed on one of the data sets because of low signal throughout the image. FIGS. 2A-2D and 3A-3D show the results from a gated, breath-held, spiral spin-echo scan of the left coronary arteries of a normal volunteer. For this data set, the field of view (FOV) was 28 cm2, the slice thickness was 7 mm, and the TE was 10 ms. Both Noll et al.'s (11) objective function and Lee et al.'s objective function (19) showed comparable linear field map estimation for the data sets we tested, probably due to the small off-resonance phase accrual present in the low-frequency k-space data we used.

FIGS. 2A-2D show a comparison of a low-resolution field map calculated using our automatic method and one calculated from two extra single-shot spiral acquisitions. To demonstrate the effect of weighting in linear map estimation, the maps are weighted by the same low-resolution magnitude image, shown in FIG. 2A. FIGS. 2B and 2C show the resulting map calculated using our automatic method and from extra data acquisitions, respectively. Both maps were set to zero where the weighting image has no signal. Note that the low-resolution map calculated by our automatic method is smoother than that calculated from extra data acquisitions. This is because the summation window used in the automatic method smooths the field map. FIG. 2D shows the map calculated from extra data acquisitions after it has been smoothed by an averaging window with the same size as that of the summation window used in the automatic estimation. The smoothing was conducted before the map was weighted by the magnitude image and the thresholding was applied. Note that the resulting map is similar to that calculated by the automatic method. For all three field maps, the field map value was set to zero where the low-resolution magnitude image has no signal.

FIGS. 3A and 3B show the image without correction and the image with automatic linear off-resonance correction, respectively. Note that the coronary vessels are better defined (indicated by white arrows) after our method is applied. For comparison, FIG. 3C shows the image deblurred with linear off-resonance correction based on an acquired field map (6). The two methods have a similar level of deblurring on the coronary vessels. FIG. 3D shows the image deblurred by combining our linear map with Noll et al.'s (11) full map automatic method. The image shows further improvement in the definition of the coronary vessels compared to the linear corrections (indicated by white arrows).

The main advantage of our automatic linear off-resonance correction method is its efficiency when both the scan time and image reconstruction time are considered. Linear off-resonance correction based on a field map (6) has almost no computation penalty compared to image reconstruction by gridding only. Compared to the map-based linear correction method, our method needs extra computation time to estimate a low-resolution field map. The extra computation time depends mainly on the size of the map image and the number of demodulation frequencies. Usually, if the final image matrix is N×N, we can choose the map matrix N/8×N/8. A linear map usually can be effectively estimated by using 10-20 demodulation frequencies, given a normal off-resonance frequency range. Under these conditions, both theoretical and experimental work indicate that the total computation time of our automatic linear correction is about 1.7-2.5 times the total computation time of gridding. One can further decrease the computation time by performing demodulation on the k-space data after gridding, as discussed by Man et al. (21). Such an interchange of the sequence of gridding and demodulation would allow us to perform gridding only once, which may decrease the total computation time of our method down to a level that is suitable for spiral real-time imaging.

The basic rationale of the linear off-resonance correction is that the field can be approximated by a linear map. This condition usually is not violated when the field varies smoothly in space. However, when the field is significantly nonlinear in global or local regions, linear off-resonance correction methods may result in image blurring in the corresponding regions. In these conditions, full map off-resonance correction methods should be used.

The effectiveness of the automatic methods depends on the objective function's capability to capture the local off-resonance frequency. The effectiveness of the objective function largely depends on the following parameters: the size of the summation window, the power $\alpha$, and the size of the low-frequency region in k-space used to evaluate the incidental phase. We used similar values of these parameters on all of the data sets we tested. However, one should choose these parameters carefully when using automatic methods with completely different spiral scan parameters, or when using different scanners. The wrong choice of these parameters may cause automatic methods to fail.

Automatic methods are useful when field map-based methods are unreliable or undesirable, such as for real-time imaging or imaging hyperpolarized spins. However, automatic methods are prone to estimation error and sometimes can result in an inaccurate field map. For images with no contrast or very low contrast, the automatic method has difficulty tracking correct field map values. Therefore, when scan time is not a priority and the acquired field map is reliable, field map-based linear off-resonance correction can be more robust than proposed automatic off-resonance correction method. As we observed from the data sets we tested, the map-based linear correction can sometimes achieve a better level of deblurring than our automatic linear correction.

We have proposed a fast automatic linear off-resonance correction method that performs linear off-resonance correction without acquiring extra field map data sets. Our method can be a useful rapid deblurring technique when the field map based off-resonance correction methods are undesirable or unreliable. This method can also be used in combination with Noll et al.'s (11) algorithm to improve the extent of off-resonance correction.

Figure 4A:
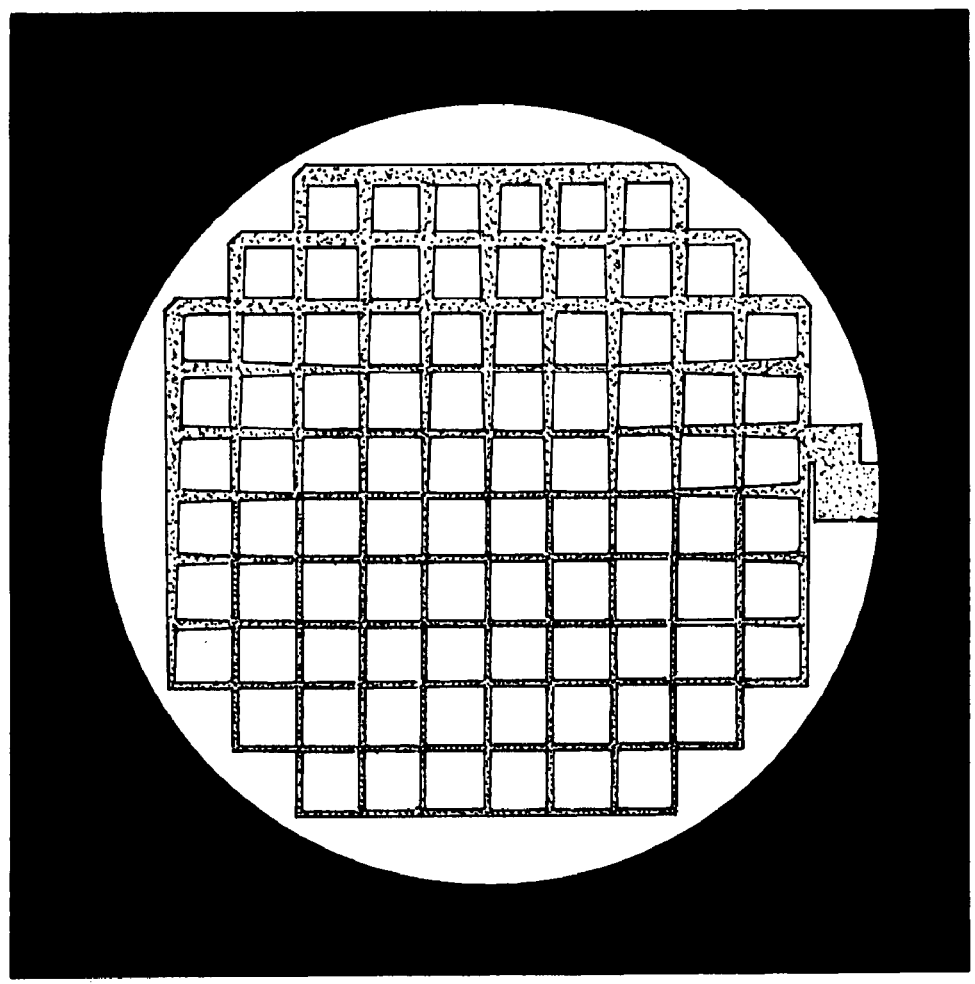
FIGS. 4A-4C show images of an ACR resolution phantom acquired using a spiral scan sequence and reconstructed using three different methods.
Figure 4B:
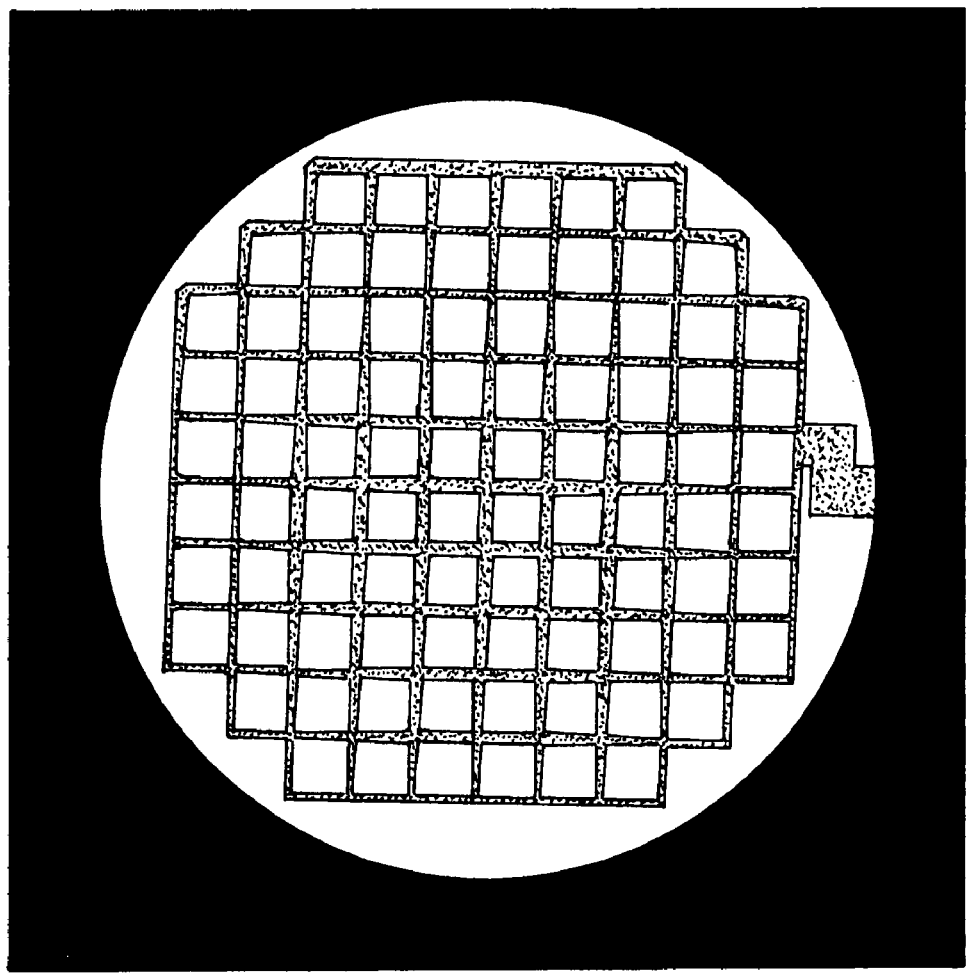
Figure 4C:
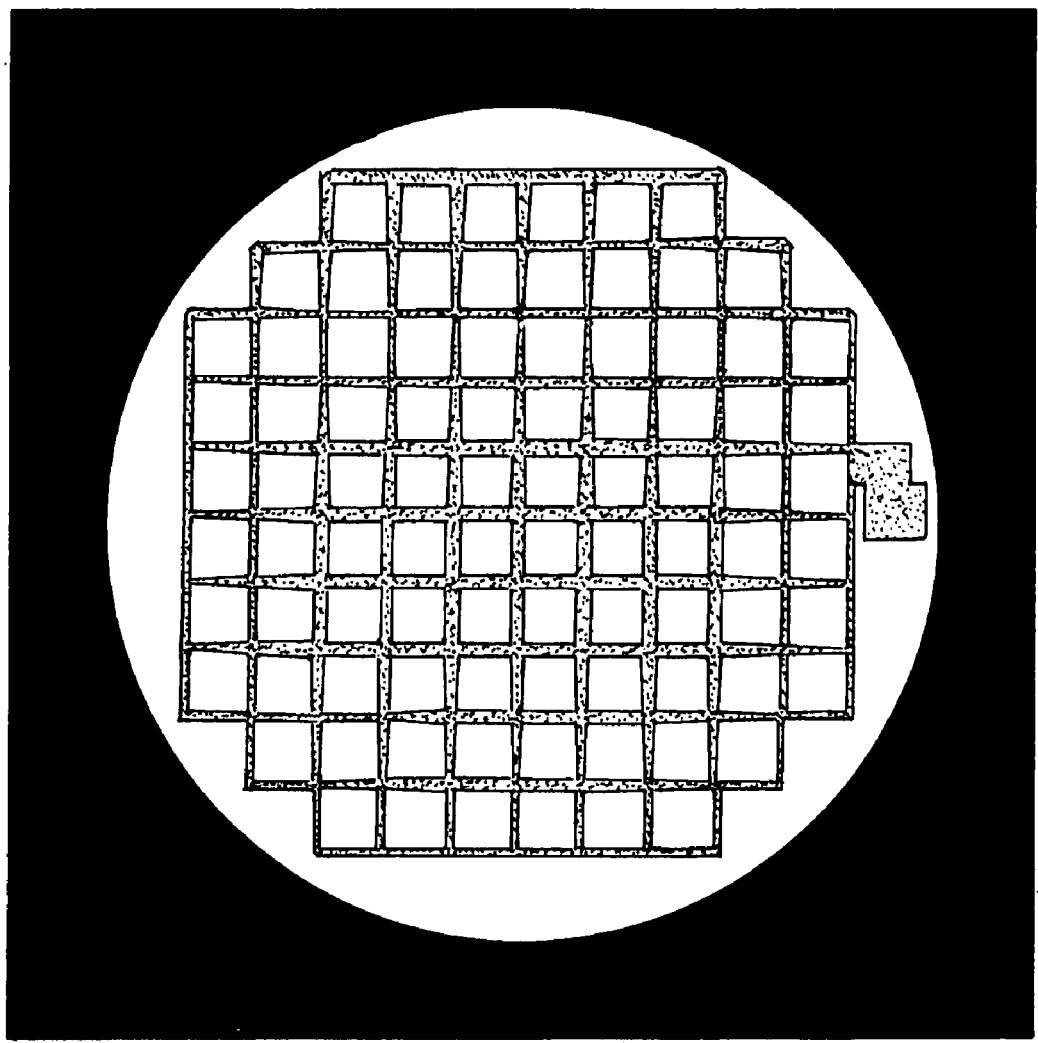

FIGS. 4A-C are images of an ACR resolution phantom acquired using a spiral scan sequence and reconstructed from the same data using three different methods. FIG. 4A is a reconstruction with no correction for inhomogeneity, illustrating substantial image blur. FIG. 4B is a reconstruction using a field map acquired separately from the image data and shows substantially decreased image blur. FIG. 4C shows an image reconstructed using the automatic method described above. No field map data are needed for this image reconstruction.

The off-resonance pattern contained both linear and non-linear terms. Thus, there is substantial blurring with no correction, and some residual blurring remains after linear correction because linear correction methods do not correct for the nonlinear spatial variations of inhomogeneity. If a higher-order shim is performed on the phantom before spiral imaging, little residual blurring is evident. We did not perform such a shim, in order to illustrate the invention. Some residual inhomogeneity is always present in vivo, even after higher order shimming, particularly in regions of rapid motion such as the heart.

The present invention is particularly applicable to time-course studies such as real-time imaging for cardiovascular or interventional applications and for functional MRI time course studies, where the off-resonance pattern might change with time and where collecting periodic field maps would interfere with image acquisition.

FIG. 5 shows a block diagram of a system 500 on which the preferred embodiment can be implemented. MRI coils 502 image a region of interest in a patient P. A computer 504, which can be any suitable computing device, receives raw data signals from the coils and outputs the image on an image output device 506, which can be a display screen, printer, or any other suitable device. Alternatively, the raw image data could have been taken earlier and stored; the taking of the image data in the present invention should be construed to include both possibilities.

While a preferred embodiment of the present invention has been set forth in detail above, those skilled in the art who have reviewed the present disclosure will readily appreciate that other embodiments can be realized within the scope of the present invention. For example, numerical examples are illustrative rather than limiting. Therefore, the present invention should be construed as limited only by the appended claims.

We claim:
1. A method for forming an image of an object, the method comprising:
   (a) taking magnetic resonance imaging data of the object;
   (b) estimating a field map from the magnetic resonance imaging data by demodulating the magnetic resonance imaging data at a plurality of demodulation frequencies, wherein the field map has a lower resolution than the magnetic resonance imaging data;
   (c) fitting a linear map to the field map; and
   (d) forming the image using the field map.

2. The method of claim 1, wherein step (b) comprises determining which of the plurality of demodulation frequencies results in a minimized blur in the field map.

3. The method of claim 2, wherein the blur is minimized by calculating an objective function and determining which of the plurality of demodulation frequencies optimizes the objective function.

4. The method of claim 3, wherein the objective function is calculated recursively across a plurality of pixels of the magnetic resonance imaging data.

5. The method of claim 1, wherein step (c) comprises fitting the linear map to the field map using a maximum-likelihood estimator.

6. The method of claim 5, wherein the linear map is fitted to the field map using a $\chi^2$ fit.

7. The method of claim 6, wherein the linear map is fitted to the field map using weights which are proportional to image intensity.

8. A method for forming an image of an object, the method comprising:
   (a) taking magnetic resonance imaging data of the object;
   (b) estimating a field map from the magnetic resonance imaging data by demodulating the magnetic resonance imaging data at a plurality of demodulation frequencies, wherein the field map has a lower resolution than the magnetic resonance imaging data;
   (c) fitting a linear map to the field map;
   (d) using the linear map in a higher-resolution non-linear automatic correction; and
   (e) forming the image using the higher-resolution non-linear automatic correction.

9. A system for forming an image of an object, the system comprising:
   an image data taking device for taking magnetic resonance imaging data of the object;
   a processor, in communication with the image data taking device, for estimating a field map from the magnetic resonance imaging data by demodulating the magnetic resonance imaging data at a plurality of demodulation frequencies, wherein the field map has a lower resolution than the magnetic resonance imaging data; fitting a linear map to the field map; and forming the image using the field map; and
   an output, in communication with the processor, for outputting the image.

10. The system of claim 9, wherein the processor estimates the field map by determining which of the plurality of demodulation frequencies results in a minimized blur in the field map.

11. The system of claim 10, wherein the blur is minimized by calculating an objective function and determining which of the plurality of demodulation frequencies optimizes the objective function.

12. The system of claim 11, wherein the objective function is calculated recursively across a plurality of pixels of the magnetic resonance imaging data.

13. The system of claim 9, wherein the processor fits the linear map to the field map using a maximum-likelihood estimator.

14. The system of claim 13, wherein the linear map is fitted to the field map using a $\chi^2$ fit.

15. The system of claim 14, wherein the linear map is fitted to the field map using weights which are proportional to image intensity.

16. A system for forming an image of an object, the system comprising:

an image data taking device for taking magnetic resonance imaging data of the object;

a processor, in communication with the image data taking device, for estimating a field map from the magnetic resonance imaging data by demodulating the magnetic resonance imaging data at a plurality of demodulation frequencies, wherein the field map has a lower resolution than the magnetic resonance imaging data; fitting a linear map to the field map; using the linear map in a higher-resolution non-linear automatic correction; and forming the image using the higher-resolution non-linear automatic correction; and an output, in communication with the processor, for outputting the image.

* * * * *